(12) United States Patent
Chung et al.

(10) Patent No.: US 9,832,881 B2
(45) Date of Patent: Nov. 28, 2017

(54) METHOD OF MANUFACTURING TRANSPARENT ELECTRODE FILM FOR DISPLAY AND TRANSPARENT ELECTRODE FILM FOR DISPLAY

(71) Applicant: INKTEC CO., LTD., Ansan (KR)

(72) Inventors: Kwang-Choon Chung, Yongin (KR); Ji Hoon Yoo, Bucheon (KR); Joonki Seong, Anyang (KR); Dae sang Han, Seoul (KR)

(73) Assignee: INKTEC CO., LTD., Ansan (KR)

( * ) Notice: Subject to any disclaimer, the term of this patent is extended or adjusted under 35 U.S.C. 154(b) by 17 days.

(21) Appl. No.: 14/785,281

(22) PCT Filed: Apr. 18, 2014

(86) PCT No.: PCT/KR2014/003438
§ 371 (c)(1),
(2) Date: Jan. 7, 2016

(87) PCT Pub. No.: WO2014/171798
PCT Pub. Date: Oct. 23, 2014

(65) Prior Publication Data
US 2016/0234943 A1    Aug. 11, 2016

(30) Foreign Application Priority Data
Apr. 19, 2013 (KR) .......... 10-2013-0043737

(51) Int. Cl.
H05K 1/03 (2006.01)
H05K 3/10 (2006.01)
(Continued)

(52) U.S. Cl.
CPC ............. *H05K 3/103* (2013.01); *C09D 11/52* (2013.01); *H01B 1/22* (2013.01); *H05K 1/0274* (2013.01);
(Continued)

(58) Field of Classification Search
CPC ...... H05K 3/103; H05K 1/0274; H05K 1/032; C09D 11/52; H01B 1/22
(Continued)

(56) References Cited

U.S. PATENT DOCUMENTS

2008/0277381 A1    11/2008  Chung et al.
2013/0004753 A1*    1/2013  Majumdar .......... H01L 51/0024
                                                                 428/209

(Continued)

FOREIGN PATENT DOCUMENTS

JP    05-067552 B2    3/1993
JP    2004-207015 A    7/2004
(Continued)

*Primary Examiner* — Tremesha S Willis
(74) *Attorney, Agent, or Firm* — Patent Office of Dr. Chung Park

(57) ABSTRACT

Provided herein is a method for forming a transparent electrode film for display and the transparent electrode film for display, the method comprising forming an electrode pattern by printing a fine electrode pattern on a release film using a conductive ink composition; forming an insulating layer by applying an insulating resin on the release film on which the electrode pattern has been formed; forming a substrate layer by laminating a substrate on the insulating layer; and removing the release film.

7 Claims, 6 Drawing Sheets

(51) Int. Cl.
*H01B 1/22* (2006.01)
*C09D 11/52* (2014.01)
*H05K 1/02* (2006.01)
*H05K 1/09* (2006.01)
*H05K 3/00* (2006.01)
*H05K 3/12* (2006.01)

(52) U.S. Cl.
CPC ........... *H05K 1/0296* (2013.01); *H05K 1/032* (2013.01); *H05K 1/09* (2013.01); *H05K 3/002* (2013.01); *H05K 3/007* (2013.01); *H05K 3/0055* (2013.01); *H05K 3/12* (2013.01); *H05K 2203/06* (2013.01)

(58) Field of Classification Search
USPC ........ 174/255, 250, 251, 254, 256–258, 261
See application file for complete search history.

(56) References Cited

U.S. PATENT DOCUMENTS

| | | | |
|---|---|---|---|
| 2013/0319730 A1* | 12/2013 | Son | H05K 1/0298 174/251 |
| 2014/0035866 A1* | 2/2014 | Tan | G06F 3/044 345/174 |

FOREIGN PATENT DOCUMENTS

| | | |
|---|---|---|
| KR | 10-2010-0109233 A | 10/2010 |
| KR | 10-2011-0000886 A | 1/2011 |
| KR | 10-2011-0100034 A | 9/2011 |
| KR | 10-2013-0037925 A | 4/2013 |

\* cited by examiner

METHOD OF MANUFACTURING TRANSPARENT ELECTRODE FILM FOR DISPLAY AND TRANSPARENT ELECTRODE FILM FOR DISPLAY

CROSS-REFERENCE TO PRIOR APPLICATIONS

This application is a national Stage Patent Application of PCT International Patent Application No. PCT/KR2014/003438, filed on Apr. 18, 2014 under 35 U.S.C. §371, which claims priority of Korean Patent Application No. 10-2013-0043737, filed on Apr. 19, 2013, which are all hereby incorporated by reference in their entirety.

FIELD

The following description relates to a method for producing a transparent electrode film for display and the transparent electrode film for display, and more particularly, to a method for producing a transparent electrode film for display having excellent surface roughness and low resistance by printing a conductive ink composition on a release film to form a fine electrode pattern and then removing the release film thereby forming a transparent electrode film.

BACKGROUND

As various home appliances and communication devices become digitalized and highly advanced, implementation of portable displays is in desperate need. The materials for producing an electrode for display should not only be transparent and exhibit low resistance, but also have a high flexibility to ensure mechanical stability, and a coefficient of expansion that is similar to that of substrates such that even when a device is overheated or under a high temperature there is no short circuits or significant change in the sheet resistance.

Examples of well known conventional materials that can be used as a transparent conductive material include oxides, carbon nanotube (CNT), graphene, polymer conductors, metal nano wires and the like. Among these materials, indium tin oxide (ITO) is widely used to form a thin film layer in a vacuum method, but indium tin oxide is a ceramic material that shows low resistance against flexing or bending of a substrate and therefore easily cracks and causes deterioration of electrode properties, and that cannot be easily vitalized through substitution of a tin dopant, and that has an amorphous structure and therefore a high sheet resistance. Not only that, due to the rapid expansion of markets for flat panel displays, mobile devices, and touch panels and the limited reserves of indium which is the main material of indium tin oxide (ITO), the price of indium continues to increase causing a threat to the cost competitiveness of transparent conductive films. Therefore, in order to take a dominant position in the fierce competition of display technologies in the near future, it is important to develop an alternative material that could resolve the problems of ITO electrodes.

In the case of polymer conductors, polyacetylene, polypyrrole, polyphenol, polyaniline, PEDOT:POSS and the like are generally used to produce transparent conductive films. However, most polymer conductors have low solubility, the processes involved are fastidious, and it shows colors since its energy band gap is below 3 eV. Furthermore, when a polymer conductor is coated with a thin film in order to increase its transmissivity, its sheet resistance would increase, which causes a problem in actually being used as a transparent electrode. Furthermore, most polymer conductors lack atmospheric stability, and are therefore easily oxidized in the air, deteriorating the electrical conductivity. Therefore, securing the atmospheric stability is an important element in using polymer conductors.

Much research is being carried out on transparent conductive films using CNT, graphene, or metal nano wire, but these materials have problems that need to be solved in order to be used as low resistance transparent conductive films, and thus have not reached the commercialization level yet.

In order to resolve the aforementioned problems, new studies are being conducted on methods for forming fine intaglio grooves using imprinting methods and then charging a metal of low resistance, and in relation thereto, there is a method for pressing a UV curable resin with a fine mold, imprinting, and then charging an Ag paste to form a transparent conductive film. In this method however, since it is difficult to adjust the thickness of the Ag pattern to control the surface roughness of the pattern film, there are limitations to applying the method to applications where electrodes need to be contacted.

Thus, there is a need to develop a method for producing a transparent electrode where fine electrode patterns are formed having excellent surface roughness and that may be easily used in contacts between electrodes.

SUMMARY

A purpose of the present invention is to resolve the aforementioned problems of conventional techniques, that is, to provide a method for producing a transparent electrode film for display by printing a conductive ink composition on a release film to form a fine electrode pattern and then removing the release film, thereby forming a transparent electrode film for display having excellent surface roughness and low resistance, and the transparent electrode film for display.

Another purpose of the present invention is to provide a method for producing a transparent electrode film for display by printing a conductive ink composition on a release film to form a fine electrode pattern and then forming a substrate layer, thereby forming a transparent electrode film for display having excellent adhesion and low resistance properties, and the transparent electrode film for display.

Another purpose of the present invention is to provide a method for producing a transparent electrode film for display by using a metal complex compound or metal precursor, thereby forming a transparent electrode film for display having reduced resistance while maintaining excellent electric properties, and the transparent electrode film for display.

Another purpose of the present invention is to provide a method for producing a transparent electrode film for display by printing a fine electrode pattern using a conductive ink composition, and removing residue of the conductive ink composition from areas besides the fine pattern area, so that the fine pattern has low resistance and excellent transmissivity that had been difficult to be implemented according to conventional techniques, and the transparent electrode film for display.

Another purpose of the present invention is to provide a method for producing a hybrid type transparent electrode film with significantly improved electric conductivity by forming a conductive material on a fine electrode pattern after removing a release film.

According to one aspect of the present invention, there is provided a method for forming a transparent electrode film for display, the method comprising: forming an electrode pattern by printing a fine electrode pattern on a release film using a conductive ink composition; forming an insulating layer by applying an insulating resin on the release film on which the electrode pattern has been formed; forming a substrate layer by laminating a substrate on the insulating layer; and removing the release film.

The release film may be prepared by applying a silicon-based or acryl-based releasing agent on a thermo-resistant film.

The conductive ink composition may comprise at least one of a metal complex compound, metal precursor, spherical metal particles, metal plate and metal nano particles.

The fine electrode pattern may be printed on a surface of the release film by a gravure printing method, flexo printing method, offset printing method, reverse offset printing method, dispensing, screen printing method, rotary screen printing method, or inkjet printing method.

The forming an insulating layer may include applying the insulating resin on entire surface of the release film on which the electrode pattern has been formed such that grooves between the fine electrode pattern lines are filled.

A height of the insulating layer may be the same or higher than a height of the fine electrode pattern.

The forming an insulating layer may include forming two or more insulating layers by applying the insulating resin two or more times.

The substrate may be laminated on the insulating layer by hot compression, or by adhesion by an adhesive agent.

The method may further comprise managing residue conductive ink composition that remains between the fine electrode pattern when printing the fine electrode pattern at the forming an electrode pattern, by removing the residue conductive ink composition, after the removing of the release film. The managing residue conductive ink composition may include removing the residue conductive ink composition by dissolving the residue conductive ink composition using an etching solution, and pushing the dissolved residue conductive ink composition using a residue managing member.

The residue managing member may be a doctor blade, wiper, or brush, but not being limited thereto.

The etching solution may comprise at least one of an ammonium carbamate compound, ammonium carbonate compound, ammonium bicarbonate compound, carboxylic acid compound, lactone compound, lactam compound, cyclic acid anhydride compound, acid-base salt complex, acid-base-alcoholic complex and mercapto compound, and an oxidizing agent.

In an exemplary embodiment, the method may further comprise forming a conductive material to produce a hybrid type transparent electrode film, by depositing or printing the conductive material on the fine electrode pattern from which the release film has been removed. The conductive material may be ITO, AZO, CNT, graphene, or conductive polymer.

According to another aspect of the present invention, there is provided a method for producing a transparent electrode film for display, the method comprising: forming an electrode pattern by printing a fine electrode pattern on a release film using a conductive ink composition; forming an insulating layer by applying an insulating resin on entire surface of the release film such that grooves between the fine electrode pattern are filled; forming a substrate layer by laminating a substrate on the insulating layer; and removing the release film.

A height of the insulating layer of the grooves between the fine electrode pattern may be the same or higher than a height of the fine electrode pattern.

The method may further comprise managing residue conductive ink composition after the removing of the release film. The managing residue conductive ink composition may include removing the residue conductive ink composition that remains between the fine electrode pattern when printing the fine electrode pattern at the forming an electrode pattern, by dissolving the residue conductive ink composition using an etching solution, and pushing the dissolved residue conductive ink composition using a residue managing member.

The method may further comprise forming a conductive material by applying the conductive material on the fine electrode pattern from which the release film has been removed, to produce a hybrid type transparent electrode film.

According to another aspect of the present invention, there is provided a method for producing a transparent electrode film for display, the method comprising: forming an electrode pattern by printing a fine electrode pattern on a release film using a conductive ink composition; forming an insulating layer by applying an insulating resin on the release film on which the fine electrode pattern has been formed, such that the fine electrode pattern is covered by the insulating resin; forming a substrate layer by laminating the substrate on the insulating layer; removing the release film; and managing residue conductive ink composition by dissolving the residue conductive ink composition that remains between the fine electrode pattern when printing the fine electrode pattern at the forming an electrode pattern using an etching solution, and pushing and removing the dissolved residue conductive ink composition using a residue managing member.

The insulating resin may be a thermosetting resin or UV curable resin, but not being limited thereto.

The etching solution may comprise at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex and mercapto compound, and an oxidizing agent.

At the managing of residue conductive ink composition, the dissolved residue conductive ink composition may be removed by at least one of a doctor blade, wiper, and brush.

According to another aspect of the present invention, there is provided a method for producing a transparent electrode film for display, the method comprising: forming an electrode pattern by printing a fine electrode pattern on a release film using a conductive ink composition; forming an insulating layer on the release film on which the electrode pattern has been formed; forming a substrate layer by laminating the substrate on the insulating layer; removing the release film; managing residue conductive ink composition that involves removing the residue conductive ink composition that remains between the fine electrode pattern when printing the fine electrode pattern at the forming an electrode pattern, by dissolving the residue conductive ink composition using an etching solution, and pushing and removing the dissolved residue conductive ink composition; and forming a conductive material to produce a hybrid type transparent electrode film by depositing or printing the conductive material on the fine electrode pattern from which the release film has been removed.

The release film may be formed by applying a silicon-based or acryl-based releasing agent on a thermo-resistant film, but the releasing agent not being thereto.

At the forming a conductive material, the conductive material may be ITO, AZO, CNT, graphene, or conductive polymer.

According to another aspect of the present invention, there is provided a transparent electrode film for display, the film comprising an electrode pattern formed by printing a conductive ink composition on a release film in a fine electrode pattern; an insulating layer formed by applying an insulating resin on the release film on which the electrode pattern has been formed; and a substrate layer laminated on one surface of the insulating layer that is opposite to another surface of the insulating layer contacting with the release film, wherein the electrode pattern is embedded inside the insulating layer, one surface of the electrode pattern being exposed towards the another surface of the insulating layer and thus contacting with the release film.

According to another aspect of the present invention, there is provided a transparent electrode film for display, the film comprising an electrode pattern formed by printing a conductive ink composition on a release film in a fine electrode pattern; an insulating layer formed by applying an insulating resin on entire surface of the release film such that grooves between the fine electrode pattern are filled; and a substrate layer laminated on one surface of the insulating layer that is opposite to another surface of the insulating layer contacting with the release film, wherein the electrode pattern is embedded inside the insulating layer, one surface of the electrode pattern being exposed towards the another surface of the insulating layer and thus contacting with the release film.

According to another aspect of the present invention, there is provided a transparent electrode film for display, the film comprising an electrode pattern formed by printing a conductive ink composition on a release film in a fine electrode pattern; an insulating layer formed by applying an insulating resin on the entire surface of the release film such that grooves between the fine electrode pattern are filled; and a substrate layer laminated on one surface of the insulating layer that is opposite to another surface of the insulating layer contacting with the release film, wherein the electrode pattern is embedded inside the insulating layer, one surface of the electrode pattern being exposed towards the another surface of the insulating layer and thus contacting with the release film, and wherein residue conductive ink composition remaining between the fine electrode pattern has been removed by dissolving the residue conductive ink composition using an etching solution, and pushing the dissolved residue conductive ink composition.

According to another aspect of the present invention, there is provided transparent electrode film for display, the film comprising an electrode pattern formed by printing a conductive ink composition on a release film in a fine electrode pattern; an insulating layer formed by applying an insulating resin on the release film on which the electrode pattern is formed; and a substrate layer laminated on one surface of the insulating layer that is opposite to another surface of the insulating layer contacting with the release film, wherein the electrode pattern is embedded inside the insulating layer, one surface of the electrode pattern being exposed towards the another surface of the insulating layer and thus contacting with the release film, and further comprising a conductive material formed on the fine electrode pattern from which residue conductive ink composition has been removed by dissolving the residue conductive ink composition using an etching solution, and pushing the dissolved residue conductive ink composition at the state where the release film has been removed.

The conductive ink composition may comprise at least one of a metal complex compound, metal precursor, spherical metal particles, metal plate and metal nano particles.

The insulating resin may be a thermosetting resin or UV curable resin.

The etching solution may comprise at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex, and mercapto compound, and an oxidizing agent.

The conductive material may be ITO, AZO, CNT, graphene, or conductive polymer.

The transparent electrode film for display may have a surface roughness (Ra) of 0.05 to 0.3 μm.

The transparent electrode film for display may have a sheet resistance of 10 mΩ/sq to 100 kΩ/sq.

The transparent electrode film for display may have a transmissivity of 60 to 99%.

A method for producing a transparent electrode film for display and the transparent electrode film for display according to the present invention has one or more of the following effects.

Since a transparent electrode film is produced by printing a conductive ink composition on a release film to form a fine electrode pattern and then removing the release film, the fine electrode pattern is exposed on the surface in the direction where the release film is removed, which enables easy contact between electrodes, it is possible to provide a method for producing a transparent electrode film for display having excellent surface roughness, and the transparent electrode film for display.

Since a fine electrode pattern and an insulating layer are formed sequentially on the release film, and a substrate layer is formed by bonding using a hot compression bonding method or an adhesive agent, it is possible to provide a method for producing a transparent electrode film for display having improved adhesion between the fine electrode pattern and substrate layer, and the transparent electrode film for display.

Since a conductive material containing a metal complex compound or metal precursor is used as the conductive ink composition for forming a fine electrode pattern, it is possible to simultaneously improve optical, electrical, and mechanical characteristics.

By dissolving and thus removing the residue fine metal composition remained on area where the fine electrode pattern is not formed after removing the release film, it is possible to improve the transmissivity and withstand voltage.

The hybrid type transparent electrode film where conductive materials of ITO, AZO and the like are formed on the fine electrode pattern provides excellent interface characteristics between two electrodes, and may thus be applied to areas requiring high conductivity and reliability.

The effects of the present invention are not limited to the aforementioned effects, and other effects will be apparent for one skilled in the art from the description in the claims.

DETAILED DESCRIPTION

Figure 1:
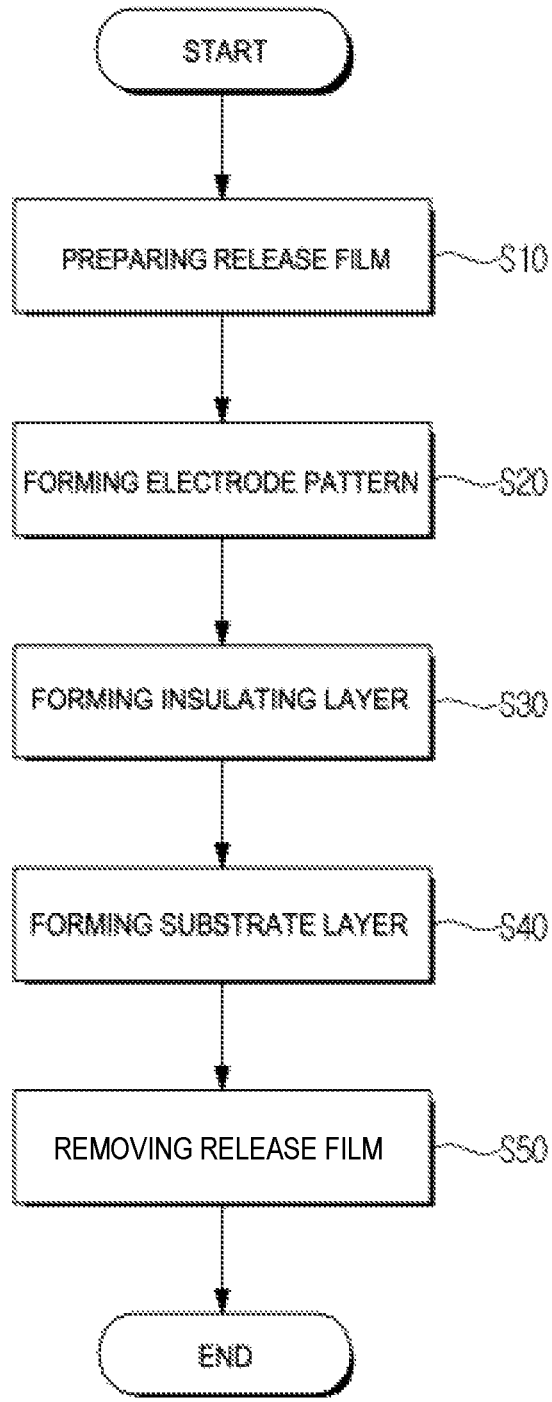
FIG. 1 is a flowchart sequentially showing a method for producing a transparent electrode film for display according to an example of the present invention.
Figure 2:
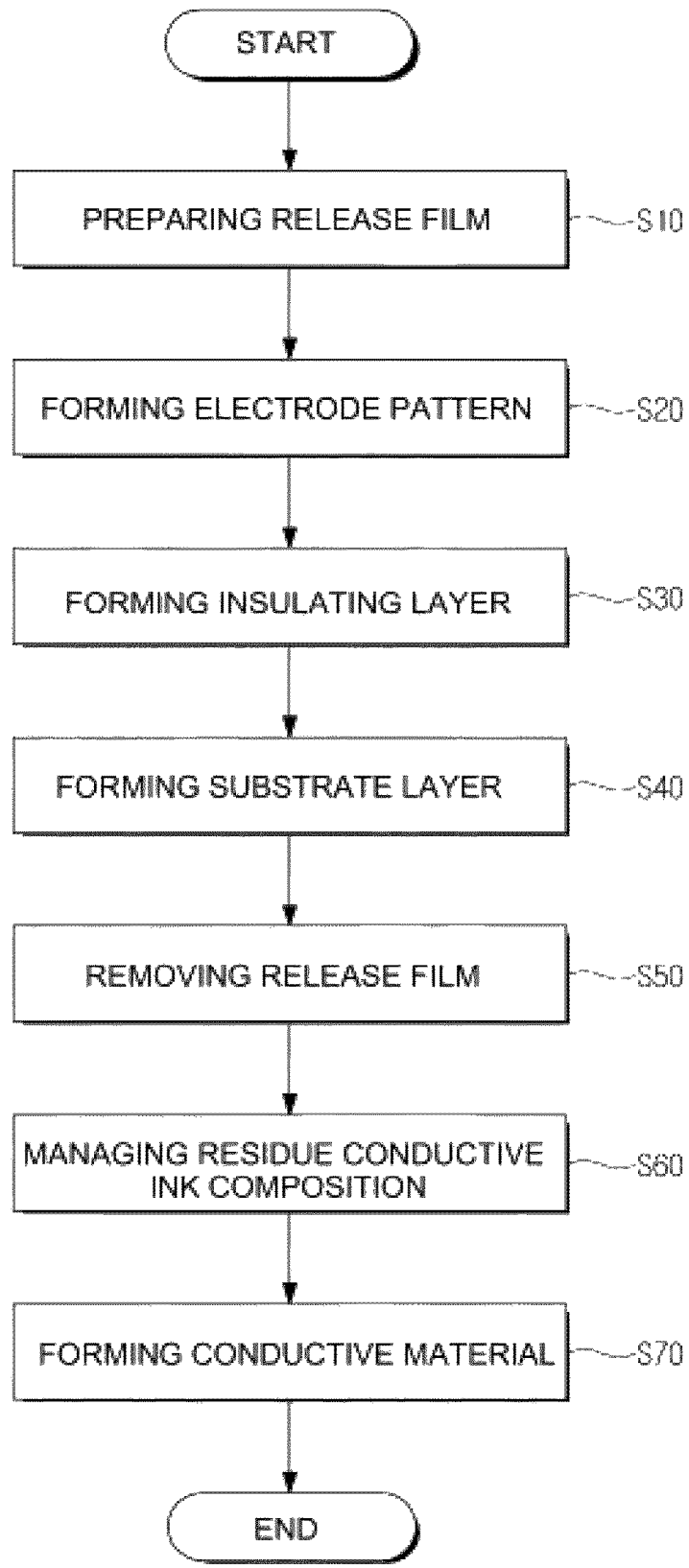
FIG. 2 is a flowchart sequentially showing a method for producing a transparent electrode film for display according to another example of the present invention.

The advantages and features of the present invention, and methods for achieving those advantages and features will be apparent with reference to the following Examples described in detail hereinafter. However, the present invention is not to be construed as limited to the following Examples, but may be realized in a variety of configurations. Therefore, the following Examples are merely intended to provide a scope of the present invention for one skilled in the art, and the present invention is to be defined within the scope of the claims. Like reference numerals refer to the same components through the specification.

Spatially relative terms "below", "beneath", "lower", "above", "upper" and the like may be used to easily describe correlations between one component and other components, as illustrated in the drawings. The spatially relative terms should be construed as including different directions of the components when used or operated in addition to the directions illustrated in the drawings. For example, a component described as being "below" or "beneath" another component may be "above" that component when the component is overturned. Therefore, the exemplary terms "below" and "beneath" may include both up and down directions. Components may be oriented towards other directions, and thus the spatially relative terms may be construed according to those other directions.

Thickness and size of each component in the drawings are exaggerated, omitted or schematically illustrated for the sake of clear and easy illustration. Furthermore, the size and area of each component do not necessarily reflect the actual size and area, either.

Hereinafter, the present invention will be explained based on the drawings for explaining a method for producing a transparent electrode film for display according to Examples of the present invention.

As illustrated in FIG. 1, a method for producing a transparent electrode film for display according to an example of the present invention includes preparing a release film (S10), forming an electrode pattern (S20), forming an insulating layer (S30), forming a substrate layer (S40), and removing the release film (S50).

Preparing Release Film (S10)

The step of preparing a release film (S10) is a step of preparing a release film comprising a releasing agent applied on a thermo-resistant film so as to provide the release film on which a fine electrode pattern will be formed.

The release film used herein may be a release coat film with an adjusted release force, the release coat film being prepared by applying a releasing agent on the thermo-resistant film.

Examples of the thermo-resistant film that may be used herein includes polyethylene naphthalate (PEN), polyethylene terephthalate (PET), polyethylene (PE), polyimide (PI), and polycarbonate (PC), but without limitation, and thus various well known thermo-resistant films of the related art may be used.

The releasing agent may desirably be a silicon-based or acrylic releasing agent.

A silicon-based releasing agent is more effective since it has thermo-resistance of not being severely contracted even under hot compression processes, and since its release force may be easily adjusted. Therefore, a silicon-based releasing agent is a more desirable releasing agent.

Just as the thermo-resistant film, various well known releasing agents of the related art may be used, either independently or in combinations.

Examples of methods for applying such a releasing agent on a thermo-resistant film include micro-gravure coating method, gravure coating method, slot die method, reverse kiss or rotary screen coating method, but without limitation.

Forming Electrode Pattern (S20)

The step of forming an electrode pattern (S20) is a step of forming a fine electrode pattern using a conductive ink composition on the release film.

The conductive ink composition is printed on the surface of release film where the releasing agent is applied.

The conductive ink composition may desirably be a metal complex compound, metal precursor, spherical metal particles, metal flakes, metal nano particles, or a combination of two or more thereof.

More desirably, a metal complex compound or metal precursor may be used. Furthermore, a metal complex compound or metal precursor may be reduced to nano size metal particles, and be used as a blend. By using this, it is possible to easily form a fine nano size electrode pattern that could not have been formed according to conventional techniques.

The metal precursor that may be used herein is represented as $M_nX$, wherein M is Ag, Au, Cu, Ni, Co, Pd, Ti, V, Mn, Fe, Cr, Zr, Nb, Mo, W, Ru, Cd, Ta, Re, Os, Ir, Al, Ga, Ge, In, Sn, Sb, Pb, or Bi; n is an integer of 1 to 10; and X represents oxygen, sulfur, halogen, cyano, cyanate, carbonate, nitrate, sulfate, phosphate, thiocyanate, chlorate, perchlorate, tetrafluoroborate, acetylacetonate, mercapto, amide, alkoxide, or carboxylate. For example, one or more of the following may be selected and used as the metal precursor: metal carboxylate such as gold acetate, palladium oxalate, 2-ethyl hexanoic acid silver, 2-ethyl hexanoic acid copper, iron stearate, nickel formate, and zinc citrate; a metal compound such as silver nitrate, copper cyanate, cobalt carbonate, platinum chloride, gold chloride, tetrabutoxy titanium, dimethoxy zirconium dichloride, aluminum isopropoxide, vanadium oxide, tantalum methoxide, bismuth acetate, dodecyl mercapto gold, indium acethyl acetonate and the like.

General methods for producing metal nano particles include physical methods of physically pulverizing a metal lump, and chemical producing methods.

More specifically, chemical methods include an aerosol method of spraying high-pressure gas for pulverization, pyrolysis method using a metal compound and a gas reductant for pyrolysis pulverization, condensation-evaporation method of heating and evaporating a subject material for pulverization, sol gel method, hydrothermal synthesis method, ultrasonic wave synthesis method, micro-emulsion method, and liquid reduction method.

The liquid reduction method is most widely used since it is regarded as easily forming and controlling nano particles and as most economical, but in the present invention, any method can be used as long as it forms nano particles.

A method for producing nano particles in a liquid reduction method is specifically explained in Korean Patent Application No. 2006-0074246 filed by the same applicant as the present invention. Advantages of Korean Patent Application No. 2006-0074246 include that the size of particles are uniform and their cohesiveness is minimized, and that it is possible to form a dense thin film or fine pattern having a high conductivity even when sintered for a short period of time under a low temperature of below 150° C.

Besides the metal conductive material, additives such as a solvent, stabilizer, dispersant, binder resin, releasing agent, reductant, surfactant, wetting agent, thixotropic agent, leveling agent, thickening agent and the like may be further included when necessary.

It is desirable that the binder resin has an excellent adhesion with various substrates. Examples of organic polymer that may be used in the binder resin include polypropylene, polycarbonate, polyacrylate, polymethylmethacrylate, celluloseacetate, polyvinylchloride, polyurethane, polyester, alkyd resin, epoxy resin, phenoxy resin, melamine resin, phenol resin, phenol-modified alkyd resin, epoxy-modified alkyd resin, vinyl-modified alkyd resin, silicon-modified alkyd resin, acryl melamine resin, polyisocyanate resin, epoxy ester resin and the like, but without limitation.

Furthermore, there are cases where a solvent is necessary in order to form a uniform thin film. Examples of the solvent that may be used include alcohols such as ethanol, isopropanol, and butanol, glycols such as ethyleneglycol and glycerin; acetates such as ethylacetate, butylacetate, methoxypropylacetate, carbitolacetate, and ethylcarbitolacetate; ethers such as methylcellosolve, butylcellosolve, diethylether, tetrahydrofuran, and dioxane; ketones such as methylethylketone, acetone, dimethylformamide, and 1-methyl-2-pyrolidone; hydrocarbons such as hexane, heptane, dodecane, paraffin oil, and mineral spirit; aromatics such as benzene, toluene, and xylene; halogenated solvent such as chloroform or methylenechloride, and carbontetrachloride; acetonitrile, dimethylsulfoxide, or a combination thereof, but without limitation.

The method for printing the conductive ink composition on the surface of the releasing agent may desirably include a gravure printing method, flexo printing method, offset printing method, reverse offset printing method, dispensing, screen printing method, rotary screen printing method, and inkjet printing method. Herein, the conductive ink composition may be coated by one or more times repeatedly.

Since the print characteristics may vary depending on the metal content, content and volatile temperature of the solvent, viscosity, and thixotropicity characteristics, it is necessary to optimize the rheology of the composition to the filling method by adjusting the components of the conductive ink according to each method.

Forming Insulating Layer (S30)

The step of forming an insulating layer (S30) is a step of forming an insulating layer on the release film on which an electrode pattern has been formed at the step of forming an electrode pattern (S20).

The material constituting the insulating layer may desirably be a composition that includes a thermosetting resin and/or an UV curable resin.

There is no limitation to the resin composition as long as the composition allows various bridging reactions, but that has excellent thermo-resistance and light transmissivity.

The method for forming an insulating layer may be a well known conventional method, desirably an S-Knife coating method, gravure coating method, flexo coating method, screen coating method, rotary screen coating method, slot die or micro gravure coating method, but without limitation.

The height of the insulating layer between the fine electrode pattern may desirably be the same as or higher than the height of the fine electrode pattern, more desirably 0.1 µm or more higher than the height of the fine electrode pattern, and further desirably 1 µm or more higher than the height of the fine electrode pattern.

Furthermore, the insulating layer may be formed as a single layer, or as two or more layers formed by applying a curable resin two or more times on the release film on which the fine electrode pattern has been formed.

Forming Substrate Layer (S40)

The step of forming a substrate layer (S40) is a step of forming the substrate layer on the insulating layer formed at the step of forming insulating layer (S30).

There is no particular limitation to the type of substrate. The substrate may be a transparent material, for example plastic film or glass. Examples of the plastic film that may be used herein includes polyimide (PI), polyethyleneterephthalate (PET), polyethylenenaphthalate (PEN), polyethersulfone (PES), nylon, polytetrafluoroethylene (PTFE), polyetheretherketone (PEEK), polycarbonate, and polyarylate (PAR). These types of plastic film or glass substrate may be used, but without limitation.

For example, a method for forming the substrate layer on the insulating layer may include a hot compression method or an adhesion method using an adhesive agent.

In the case of a hot compression, the substrate may be positioned on the insulating layer, and then the two layers may be compressed and laminated under a temperature condition of 100 to 300° C., desirably 120 to 200° C., and more desirably 140 to 175° C.

In some cases, the substrate of semi-cured state in B-stage may be laminated on the insulating layer.

Since the substrate is heat-compressed and laminated after the fine electrode pattern is printed, it is easy to bond and has excellent adhesion force compared to when an electrode pattern is formed on a substrate, thereby improving the durability as the transparent electrode film.

Removing Release Film (S50)

The step of removing the release film (S50) is a step of producing the final transparent film by removing the release film.

The final transparent film is produced by removing the release film, but in order to improve the reliability of the transparent electrode film, a step of managing a residue conductive ink composition (S60) or a step of forming a conductive material (S70) may be further included.

If there is no residue conductive ink composition on the insulating layer after removing the release film, it is possible to carry out the step of forming the conductive material without managing a residue conductive ink composition. Or the film may be used as the transparent electrode film after the step of managing the residue conductive ink composition.

Not only that, it is possible to apply both the step of managing the residue conductive ink composition and the step of forming the conductive layer sequentially.

Managing Residue Conductive Ink Composition (S60)

The step of managing the residue conductive ink composition (S60) is a step of removing a conductive ink composition remaining between the fine electrode pattern, thereby improving the transmissivity as the transparent electrode film.

There are cases where the conductive ink composition remains in an area other than where the fine electrode pattern is formed during the fine electrode pattern is being printed on the surface of the releasing agent using the conductive ink composition at the step of forming electrode pattern (S20).

When the release film is removed, the residue conductive ink composition remains on the insulating layer, and the fine metal particles included in the residue conductive ink composition deteriorates the transmissivity of the transparent electrode film or causes a problem to the withstanding voltage of the transparent electrode film. Thus, by removing the residue conductive ink composition, the characteristics of the transparent electrode can be significantly improved.

In order to dissolve the residue conductive ink composition remaining between the fine electrode pattern, it is possible to apply an etching solution on the insulating layer surface. The method for applying an etching solution may be performed by a generally well known coating method.

The etching solution may desirably comprise at least one of an ammonium carbamate compound, ammonium carbonate compound, ammonium bicarbonate compound, carboxylic acid compound, lactone compound, lactam compound, cyclic acid anhydride compound, acid-base complex compound, acid-base-alcoholic complex and mercapto compound, and an oxidizing agent.

For example, the etching solution may be prepared by reacting the oxidizing agent and one or more of the aforementioned compounds directly or in the presence of a solvent under normal pressure or pressurization. Examples of the solvent may include water; alcohols such as methanol, propanol, isopropanol, butanol, and ethanol amine; glycols such as ethylene glycol and glycerin; acetates such as ethylacetate, butyl acetate, carbitolacetate; ethers such as diethylether, tetrahydrofuran, and dioxane; ketones such as methylethylketone and acetone; carbonhydrates such as hexane and heptane; aromatic compounds such as benzene and toluene; halogen-based solvent such as chloroform, methylene chloride and carbon tetrachloride; fluorine-based solvent such as perfluorocarbon, or a combination thereof. In a pressurized state such as in a pressure vessel, a fluorine-based solvent of a low boiling point, or liquefied carbon dioxide may be used. There is no particular limitation to the method for producing an etching solution of the present invention. That is, any generally well known method may be used as long as it is suitable to the purpose of the present invention.

Examples of the oxidizing agent that may be used as the etching solution include an oxidative gas such as oxygen and ozone; peroxide such as hydrogen peroxide, $Na_2O_2$, $KO_2$, $NaBO_3$, $(NH_4)S_2O_8$, $H_2SO_5$, $(CH_3)_3CO_2H$, $(C_6H_5CO_2)_2$ and the like; hyperoxidate such as $HCO_3H$, $CH_3CO_3H$, $CF_3CO_3H$, $C_6H_5CO_3H$, m-$ClC_6H_5$—$CO_3H$ and the like; generally well known oxidative inorganic acid such as nitric acid, sulfuric acid, iodine ($I_2$), $Fe(NO_3)_3$, $Fe_2(SO_4)_3$, $K_3Fe(CN)_6$, $(NH_4)_2Fe(SO_4)_2$, $Ce(NH_4)_4(SO_4)_4$, $NaIO_4$, $KMnO_4$, $K_2CrO_4$ and the like; and metal or nonmetallic compounds. One of these oxidizing agents or a combination thereof may be used.

Desirably, hydrophilic characteristics may be provided to the etching solution in order to effectively dissolve the residue conductive ink remaining on the surface of the insulating layer. It is desirable to adjust the extent of hydrophilic property of the etching solution by adjusting the carbon number of the ammonium carbamate compound, ammonium carbonate compound, ammonium bicarbonate compound, carboxylic acid compound, lactone compound, lactam compound, cyclic acid anhydride compound, acid-base complex compound, acid-base-alcoholic complex, and mercapto compound.

Herein, the ammonium carbamate compound, ammonium carbonate compound, and ammonium bicarbonate compound are specifically explained in Korean Patent No. 0727466, and examples of the carboxylic acid compound that may be used herein include benzoic acid, oleic acid, propionic acid, malonic acid, hexanoic acid, octanoic acid, decanoic acid, neodecanoic acid, oxalic acid, citric acid, salicylic acid, stearic acid, acrylic acid, succinic acid, adipic acid, glycolic acid, isobutyric acid, and ascorbic acid.

Examples of the lactone compound that may be used herein include β-propiolactone, γ-propiolactone, γ-butyrolactone, γ-thiobutyrolactone, α-methyl-γ-butyrolactone, β-methyl-γ-butyrolactone, γ-valerolactone, γ-caprolactone, γ-octanoiclactone, δ-valerolactone, 1,6-dioxaspiro[4,4]nonane-2,7-dione, α-methylene-γ-butyrolactone, γ-methylene-γ-butyrolactone, ε-caprolactone, lactide, glycolide, tetronic acid, 2(5H)-furanone, β-hydroxy-γ-butyrolactone, mevaloniclactone, 5,6-dihydro-2H-pyran-2-pyran-one, δ-valerolactone, ε-caprolactone, γ-caprolactone, γ-octanoic lactone and the like.

Examples of the lactam compound that may be used herein include 2-azetidinone, 2-pyrrolidinone, 5-methoxy-2-pyrrolidinone, 5-methyl-2-pyrrolidinone, N-methylcaprolactam, 2-azacyclononanone, N-acetylcaprolactame and the like.

Examples of the cyclic acid anhydride that may be used herein include itaconic anhydride, succinic anhydride, maleic anhydride, glutaric anhydride, octadecyl succinic anhydride, 2,2-dimethyl succinic anhydride, 2-dodecene-1-yl succinic anhydride, hexafluoroglutaric anhydride, 3,3-dimethylglutaric anhydride, 3-ethyl-3-methyl glutaric anhydride, 3,5-diacetyltetrahydropyran-2,4,6-trione, diglycolic anhydride, and the like.

Examples of the mercapto compound that may be used herein include 1-methane thiol, 1-ethane thiol, 2-butaine thiol, 1-heptane thiol, 1-octane thiol, 1-decane thiol, 1-hexadecane thiol, thio acetic acid, 6-mercaptohexanoic acid, thio benzoic acid, furfuryl mercaptane, cyclohexanethiol, 11-mercapto-1-undecanol, 2-mercaptoethanol, 3-mercapto-1-propanol, thiosalicylic acid, 1-thioglycerol, 2-naphthalenethiol, methyl 3-mercaptopropionate, γ-mercapto propyltrimethoxysilane and the like, but without limitation. One of these compounds or a combination thereof may be used.

The etching speed of the aforementioned etching solution may desirably be controlled by adjusting an soaking time of the etching solution during the coating process, or by adjusting the concentration of the oxidizing agent or of the ammonium carbamate compound, ammonium carbonate compound, ammonium bicarbonate compound, carboxylic acid compound, lactone compound, lactam compound, cyclic acid anhydride, acid-base complex, acid-base-alcoholic complex, and mercapto compound in the etching solution. And when necessary, the etching process may be repeated. Furthermore, in the case of an etching solution that includes an inorganic acid or base, the etching solution may be washed and removed using additional water or an organic solvent.

There is no limitation to a method or a managing member for pushing the dissolved residue conductive ink composition, but a doctor blade, wiper or brush may be used. More desirably, a brush may be used. A brush may reduce the physical force thereby preventing scratches on the substrate surface and loss of ink.

This may be performed at least once, by various methods, especially, by the doctor blade, wiper, brush, or a combination thereof.

It is possible to push the residue ink composition dissolved using the residue managing member, thereby removing the metal material or organic material that are components of the residue conductive ink composition that remains on the surface between the fine electrode pattern on the insulating layer.

Besides the above, additional vibration, fluctuation or air may be used as a way to push the dissolved residue conductive ink composition.

Forming Conductive Material (S70)

The step of forming a conductive material (S70) is a step of depositing or printing a conductive material on the fine electrode pattern from which the release film has been removed so as to produce a hybrid type transparent electrode film.

This step may be added when necessary in order to be used in an internal electrode of a device.

Furthermore, the step of forming a conductive material (S70) may be performed right after the step of removing the release film (S50), or the step of removing the residue conductive ink composition (S60), and when a conductive material is formed on the fine electrode pattern after the residue conductive ink composition is removed, it is possible to realize a transparent electrode film with a high reliability.

The conductive material that may be formed on the fine electrode pattern may desirably be ITO, AZO, CNT, graphene or conductive polymer, wherein the conductive polymer may be PEDOT(poly(3,4-ethylenedioxythiophene)) or PSS:PEDOT(poly(3,4-ethylenedioxythiophene):poly(4-styrenesulfonate).

The conductive material may be deposited and patterned on the fine pattern electrode or directly printed thereon. The materials for ITO or AZO may desirably be vacuum-sputtered in a target format or made into ink and then printed as a thin film coating composition.

Such a hybrid type transparent electrode film has excellent interfacial properties between two electrodes, and thus it may be used in applications where require high conductivity and high reliability.

The aforementioned step for producing a transparent electrode film may be performed by a roll-to-roll continuous process which increases the production speed and thus the producing efficiency.

Hereinafter, the present invention will be explained in detail with reference to FIG. 3.

FIGS. 3a to 3j are cross-sectional views sequentially showing a method for producing a transparent electrode film for display according to an example of the present invention.

Figure 3A:
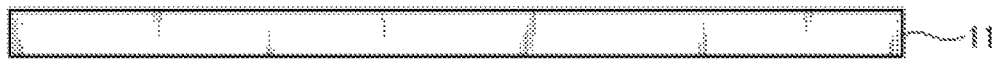
FIG. 3a to FIG. 3j are cross-sectional views sequentially showing a method for producing a transparent electrode film for display according to an example of the present invention.

As illustrated in FIG. 3a, a thermo-resistant film 11 is prepared. The thermo-resistant film 11 may be one of a variety of films made of a material such as PEN, PET, PE, PL, and PC.

Figure 3B:

FIG. 3b illustrates producing a release film 10 by applying a releasing agent 12 on the thermo-resistant film 11. There is no limitation to the release film 10 as long as it has a release force, but it is desirable that the release film 10 is a thermo-resistant release coat film of which the thermo-resistance has been adjusted.

Since a process of laminating the substrate layer 40 by a hot compression method follows, it is desirable that the releasing agent 12 has thermo-resistant characteristics such that it does not contract severely even under a hot compression process. It is effective to use a silicon releasing agent.

Figure 3C:
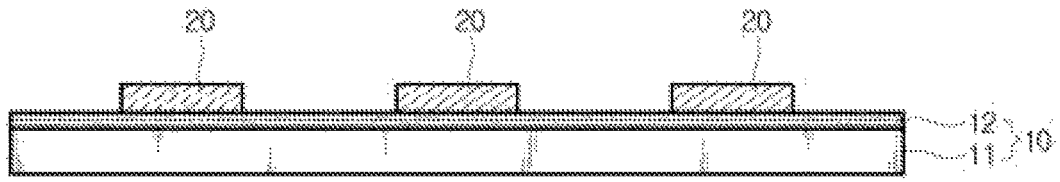

Then, as illustrated in FIG. 3c, a fine electrode pattern 20 is formed on the release film 10.

Since the release film 10 is to be removed, the fine electrode pattern 20 in a mesh format is printed on top of the releasing agent 12 having excellent release force.

The conductive ink composition may be formed using a metal complex compound or metal precursor, and it may be printed by a gravure printing method, flexo printing method, offset printing method, reverse offset printing method, dispensing, screen printing method, rotary screen printing method or inkjet printing method, but without limitation.

The printing of the conductive ink composition is not limited to once, but may be repeated depending on needs.

The fine electrode pattern 20 is printed using the conductive ink composition, and since the conductive ink composition may remain in an area other than where the fine electrode pattern 20 is formed during printing, a step of managing the residue conductive ink composition 50 may be further added.

Figure 3D:
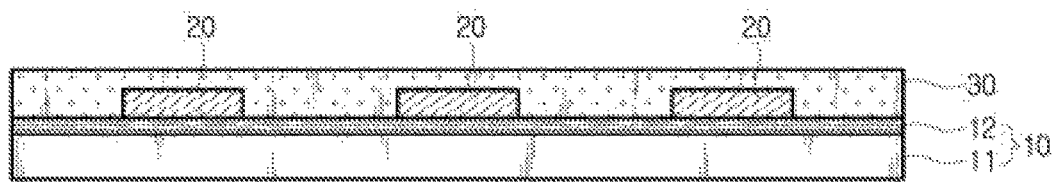

Then, as illustrated in FIG. 3d, a thermosetting or UV curable resin may be applied on the surface of the releasing agent 12 where the fine electrode pattern 20 is printed so as to form an insulating layer 30.

As illustrated in the drawings, it is effective that the height of the insulating layer 30 is higher than the height of the fine electrode pattern 20, and desirably 0.1 μm or more than the height of the fine electrode pattern, and more desirably 1 μm or more than the height of the fine electrode pattern.

Figure 3E:
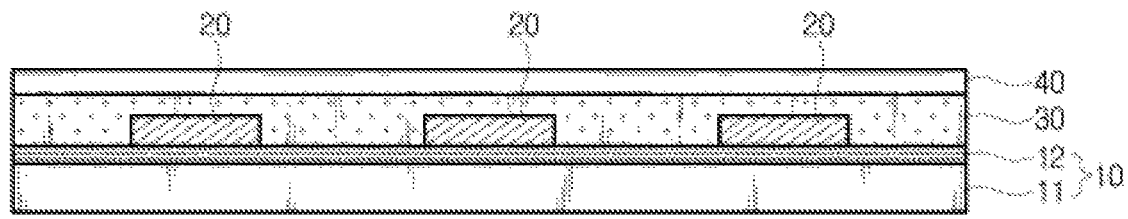

After the insulating layer 30 is formed, a substrate layer 40 is formed on the insulating layer 30 as illustrated in FIG. 3e.

There is no limitation to the type of the substrate layer 40, and a transparent material such as plastic film or glass may be used.

It is desirable that the substrate is heat-compressed at a temperature of 100 to 300° C., and then laminated on the insulating layer 30. Otherwise, it is also possible to apply an adhesive agent on the insulating layer to bond the substrate.

In the case of bonding the substrate using an adhesive agent, a transparent adhesive agent may desirably be used, and examples of the adhesive agents may include one or more of polyvinylalcohol-based adhesive agent, acryl-based adhesive agent, vinylacetate-based adhesive agent, urethane-based adhesive agent, polyester-based adhesive agent, polyolefin-based adhesive agent, and polyvinylalkylether-based adhesive agent.

There is no limitation to the thickness of an adhesive layer. The thickness of the adhesive layer may be set to a generally acceptable thickness in consideration of the properties.

Figure 3F:
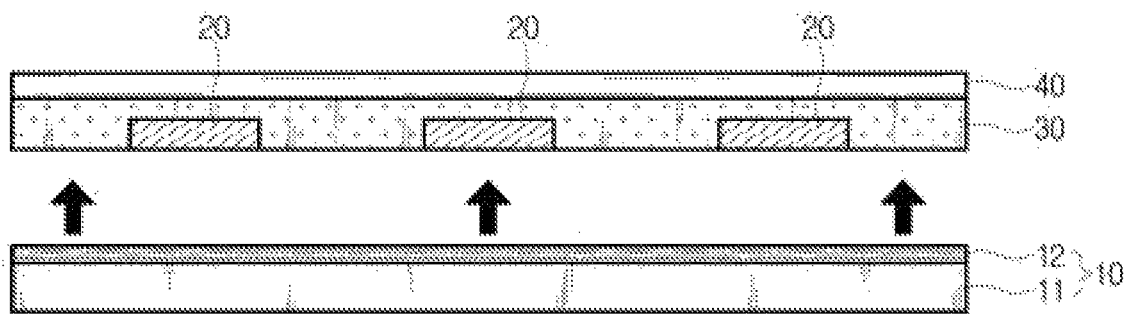

After laminating the substrate, the release film 10 may be removed so as to produce a transparent electrode film. This is illustrated in FIG. 3f.

By adjusting the release force of the releasing agent 12 of the release film 10, the release film 10 is separated from the insulating film 30 where the fine electrode pattern is formed.

Figure 3G:
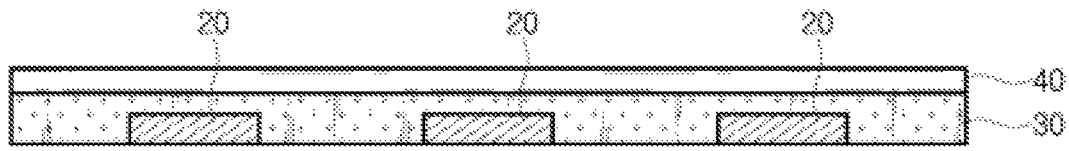

Therefore, as illustrated in FIG. 3g, since the fine electrode pattern 20 is exposed to outside, it is possible to realize a transparent electrode film for display having excellent surface roughness.

Figure 3H:
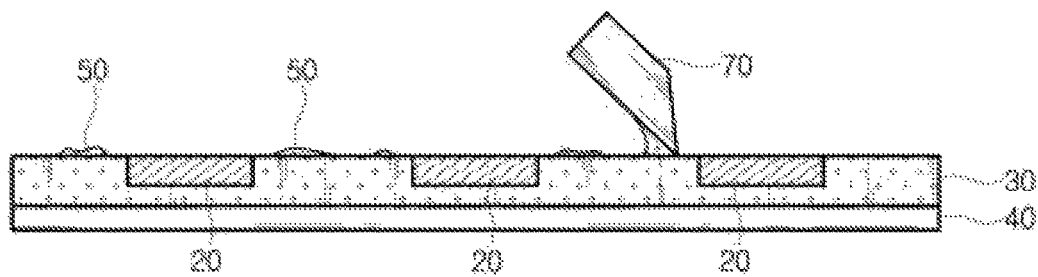
Figure 3I:
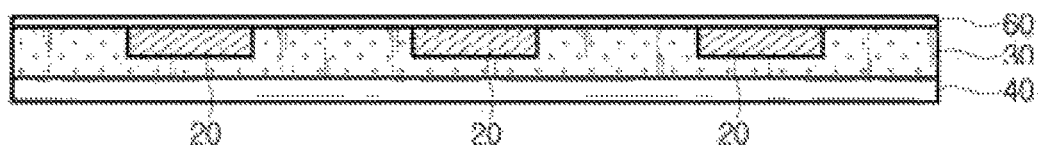
Figure 3J:
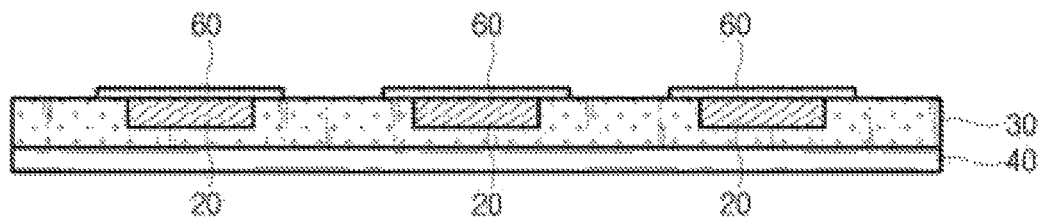

In order to improve the reliability of the transparent electrode film, processes of FIGS. 3h, 3i, and 3j may be additionally performed.

According to FIG. 3h, as aforementioned, when printing the conductive ink composition to form a fine electrode pattern 20, the conductive ink composition may remain areas where the fine electrode pattern 20 is not formed, and since there still remains the conductive ink composition on the insulating layer 30 after removing the release film 10, a process of removing the residue conductive ink composition may be additionally performed.

By dissolving the residue conductive ink composition 50 and pushing it, it is possible to remove the metal material or organic material from the area other than where the fine electrode pattern has been formed.

It is desirable to control a concentration of the etching solution or a soaking speed of the etching solution depending on the amount of the residue conductive ink composition 50.

Various physical forces may be used to push the dissolved residue conductive ink composition, but in the drawings, the doctor blade 70 was used. This may be performed once or more times, and various types of squeezes may be used.

By removing the residue conductive ink composition 50, it is possible to improve the withstanding voltage characteristics and transmissivity.

As can be seen from FIG. 3i and FIG. 3j, it is possible to form a conductive material 60 on a fine electrode pattern.

As can be seen from FIG. 3i, a hybrid type transparent electrode film may be formed by printing a conductive material 60 such as ITO, AZO, NT, graphene, and conductive polymer on an insulating layer 30 where the fine electrode pattern 20 is formed, and then etching the same as illustrated in FIG. 3j.

This does not necessary have to be performed after the process of FIG. 3h. The conductive material may of course be formed on the transparent electrode film of FIG. 3g from which the release film 10 has been removed.

A transparent conductive film for display according to an embodiment of the present invention includes an electrode pattern formed on a release film in a fine electrode pattern using a conductive ink composition; an insulating layer formed by applying an insulating resin on the release film where the electrode pattern is formed; and a substrate layer laminated on one surface of the insulating layer that is opposite to another surface of the insulating layer contacting with the release film, wherein the electrode pattern is embedded inside the insulating layer, and one surface of the electrode pattern is exposed to the surface of the insulating layer to contact with the release film.

A transparent conductive film for display according to another embodiment of the present invention includes an electrode pattern formed by printing a conductive ink composition on a release film in a fine electrode pattern, an insulating layer formed by applying an insulating resin such that grooves between the fine electrode pattern are filled, and a substrate layer laminated on one surface of the insulating layer that is opposite to another surface of the insulating layer contacting with the release film, wherein the surface of the electrode pattern may be exposed to the surface of the insulating layer to contact with the release film.

A transparent conductive film for display according to another embodiment of the present invention includes an electrode pattern formed by printing a conductive ink composition on a release film in a fine electrode pattern; an insulating layer formed by applying an insulating resin on the release film so as to cover the fine electrode pattern; and a substrate layer laminated on one surface of the insulating layer that is opposite to another surface of the insulating layer contacting with the release film, wherein the electrode pattern is embedded inside the insulating layer, and one surface of the electrode pattern is exposed to the surface of the insulating layer to contact with the release film, and the residue conductive ink composition between the fine electrode pattern from which the release film has been removed is dissolved by an etching solution, and the dissolved residue conductive ink composition is pushed, thereby removing the residue conductive ink.

A transparent conductive film for display according to another embodiment of the present invention includes an electrode pattern formed by printing a conductive ink composition on a release film in a fine electrode pattern, an insulating layer formed by applying an insulating resin on the release film where the electrode pattern has been formed; and a substrate layer laminated on one surface of the insulating layer that is opposite to another surface of the insulating layer contacting with the release film, wherein the electrode pattern is embedded inside the insulating layer, one surface of the electrode pattern is exposed to the surface of the insulating layer to contact with the release film, residue conductive ink composition between the fine electrode pattern has been dissolved by an etching solution at the state where the release film has been resolved, and removed by pushing the dissolved residue conductive ink composition.

The conductive ink composition, the insulating resin, the etching solution and the conductive material are as explained in the explanation on the method for producing the transparent electrode film for display.

According to an embodiment of the present invention, the surface roughness of the transparent electrode film for display may be 0.05 to 0.3 μm, desirably 0.10 to 0.2 μm, and most desirably 0.10 to 0.15 μm.

Furthermore, the sheet resistance of the transparent electrode film for display may be 10 mΩ/sq to 10 kΩ/sq, more desirably 3.0 to 18.5 Ω/s, and most desirably 3.0 to 10.5 Ω/sq.

Furthermore, the transmissivity of the transparent electrode film for display of the present invention may be 60 to 99%, more desirably 70 to 99%, and most desirably 83 to 91%.

Hereinafter, the present invention will be explained in detail based on the Examples. The present invention is not limited to the Examples.

Example 1

A conductive metal composition (Inktec, TEC-PA-010) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed to produce a transparent electrode film. The sheet resistance, transmissivity, haze, Yellow Index, and surface roughness of the product produced were stated in table 1 below, and an SEM (Scanning Electron Microscope) image was illustrated in FIG. 4. The surface roughness was the surface roughness of the transparent electrode film formed was measured by using an NV-1000 which is a 3-dimensional measuring device made by Nanosystem.

Example 2

A conductive metal composition (Inktec, TEC-IM-20) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed to produce a transparent electrode film. The sheet resistance, transmissivity, haze, Yellow Index, and surface roughness of the product produced were stated in table 1 below, and an SEM (Scanning Electron Microscope) image was illustrated in FIG. 4.

Example 3

A conductive metal composition (Inktec, TEC-PA-021) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed to produce a transparent electrode film. The sheet resistance, transmissivity, haze, Yellow Index, and surface roughness of the product produced were stated in table 1 below, and an SEM (Scanning Electron Microscope) image was illustrated in FIG. 4.

Example 4

A conductive metal composition (Inktec, TEC-PSP-009) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed to produce a transparent electrode film. The sheet resistance, transmissivity, haze, Yellow Index, and surface roughness of the product produced were stated in table 1 below, and an SEM (Scanning Electron Microscope) image was illustrated in FIG. 4.

Example 5

A conductive metal composition (Inktec, TEC-PSP-010) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed to produce a transparent electrode film. The sheet resistance, transmissivity, haze, Yellow Index, and surface roughness of the product produced were stated in table 1 below, and an SEM (Scanning Electron Microscope) image was illustrated in FIG. 4.

Example 6

A conductive metal composition (Inktec, TEC-PA-010) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed. Then, the surface of the insulating layer on which the electron pattern was formed was soaked with an etching solution for 10 seconds, and then a first application was performed using a blade method, and then as a second application, residue conductive ink composition dissolved or dispersed in the etching solution on the surface was pushed by applying pressure using a doctor blade in a substrate direction in order to remove residue metal material and organic material on the surface of the substrate, thereby producing a transparent electrode film.

Herein, the etching solution was produced by adding 5 g of isobutyl carbamate, 83 g of isobutylamine, and 2 g of 95% 2-amino-2-methyl-1-propanol solution, and then slowly adding 10 g of 30% hydrogen peroxide, and then mixing the solution for 5 hours.

The sheet resistance, transmissivity, haze, Yellow Index, and surface roughness of the product produced were stated in table 1 below.

Example 7

A conductive metal composition (Inktec, TEC-PA-010) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed. Then, an imprint substrate filled with a metal material was laminated and dried at 120° C. for 5 minutes, thereby forming a transparent electrode film. The sheet resistance, transmissivity, haze, and Yellow Index of the product produced were stated in table 1 below.

Example 8

A conductive metal composition (Inktec, TEC-PA-010) was printed on top of a thermo-resistant silicon release coat film (SKC, SG32) in a fine electrode pattern using a reverse offset printing method (Narae Nanotech), and then dried at 130° C. for 20 minutes to form an electrode pattern of a line width of 3 μm. An insulating layer was formed by coating a UV curable resin (Minuta Technology, MIR-30) coating solution on the electrode pattern in a dry thickness of 70 μm using a slot die coater (Factive), and then a 12 μm thick PET film was hot-compressed on the insulating layer using a hot press at 120° C. for 2 minutes, and then the release coat film was removed. Then, the surface of the insulating layer on which the electron pattern was formed was soaked with an etching solution for 10 seconds, and then a first application was performed using a blade method, and then as a second application, residue conductive ink composition dissolved or dispersed in the etching solution on the surface was pushed by applying pressure using a doctor blade in a substrate direction in order to remove residue metal material and organic material on the surface of the substrate. Then, an imprint substrate filled with a metal material was laminated and dried at 120° C. for 5 minutes, thereby producing a transparent electrode film.

Herein, the etching solution was produced by adding 5 g of isobutyl carbamate, 83 g of isobutylamine, and 2 g of 95% 2-amino-2-methyl-1-propanol solution, and then slowly adding 10 g of 30% hydrogen peroxide, and then mixing the solution for 5 hours.

The sheet resistance, transmissivity, haze, and Yellow Index of the product produced were stated in table 1 below.

Comparative Example 1

A conductive ink composition (Inktec, TEC-PA-010) was screen printed (Line system) in a fine electrode pattern on top of a PET film (SKC, SH82) using a 500 mesh plate made of stainless steel (Samborn Screen), and then dried at 130° C. for 20 minutes to form a transparent electrode film of a line width of 80 μm. The sheet resistance, transmissivity, haze, Yellow Index, and surface roughness of the product produced were stated in table 1 below.

Comparative Example 2

A conductive ink composition (Inktec, TEC-PA-010) was printed in a fine electrode pattern on top of a PET film (SKC, SH82) by a gravure offset printing (Mirae NanoTech), and then dried at 130° C. for 20 minutes to form a transparent electrode film of a line width of 30 μm. The sheet resistance, transmissivity, haze, Yellow Index, and surface roughness of the product produced were stated in table 1 below.

TABLE 1

| | Sheet resistance (Ω/sq.) | Transmissivity (%) | Haze (%) | Yellow Index (%) | Surface Roughness (Ra) (μm) |
|---|---|---|---|---|---|
| Example 1 | 3.3 | 87.2 | 2.18 | 1.9 | 0.10 |
| Example 2 | 14.0 | 89.8 | 1.9 | 2.2 | 0.15 |
| Example 3 | 12.6 | 85.7 | 2.4 | 2.4 | 0.10 |
| Example 4 | 3.6 | 83.0 | 3.0 | 2.6 | 0.12 |
| Example 5 | 18.4 | 90.2 | 1.8 | 1.4 | 0.11 |
| Example 6 | 5.0 | 87.3 | 2.0 | 2.0 | 0.11 |
| Example 7 | 3.5 | 88.7 | 1.8 | 2.0 | — |
| Example 8 | 3.1 | 89.3 | 1.82 | 1.4 | — |
| Comp. Example 1 | 20.1 | 81.2 | 5.9 | 3.5 | 3.0 |
| Comp. Example 2 | 18.8 | 80.0 | 4.8 | 3.8 | 0.5 |

As can be seen from table 1 above, a transparent electrode film for display produced by the method of the present invention has an average sheet resistance of a significantly low 10.38 Ω/sq compared to the comparative example of 20 Ω/sq, and thus the electrical conductivity is better than an electrode pattern formed by the screen printing or gravure offset printing.

Furthermore, the transmissivity is high, about 88%, and the haze value is low, showing that a transparent electrode film having excellent property is formed.

Especially, the transparent electrode film according to an example of the present invention is about 0.10 μm, which is a very uniform surface roughness, whereas the transparent electrode films by the comparative examples, the surface roughness is 0.5 μm and 3.0 μm, respectively, which are not uniform, showing that the extent of contact between electrodes are significantly deteriorated.

Figure 4:
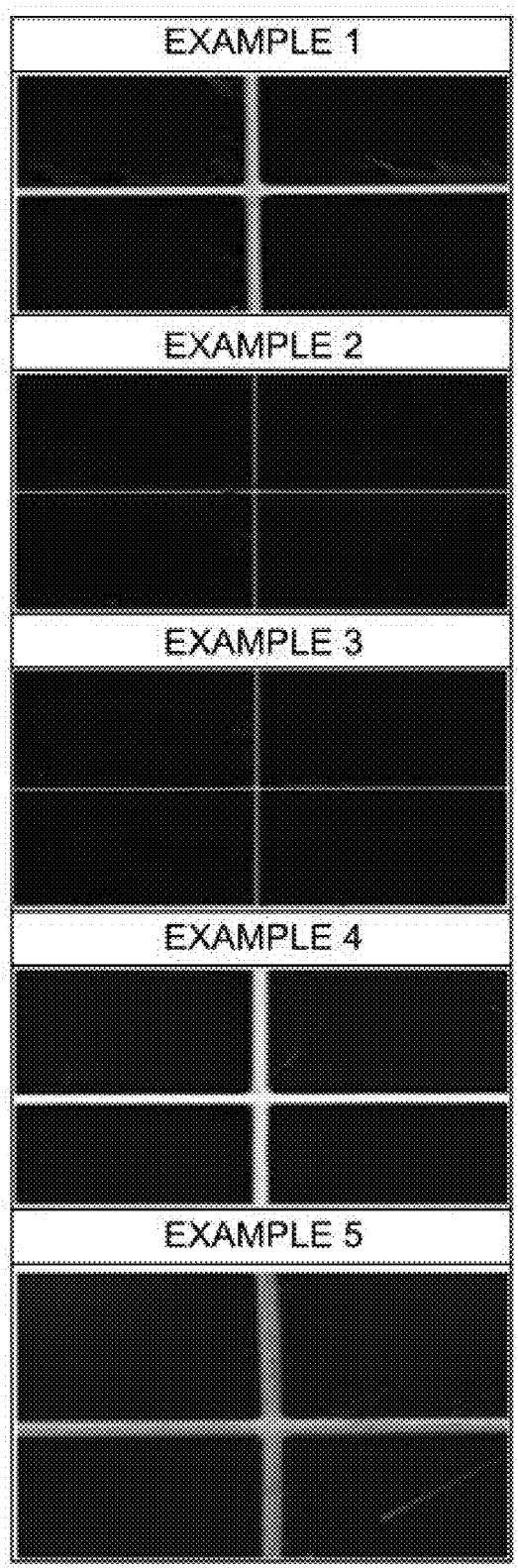
FIG. 4 illustrates SEM images of a transparent electrode film produced by examples 1 to 5.

FIG. 4 illustrates the SEM images of the electrode patterns on the transparent films of Examples 1 to 5.

The right of scope of the present invention is not limited to the aforementioned examples, but may be realized in examples of various formats within the scope of the attached claims.

While this disclosure includes desirable embodiments of the present invention, various changes in form and details may be made in these embodiments without departing from the spirit and scope of the claims and their equivalents. Therefore, the aforementioned description of the present invention does not limit the scope of the present invention defined by the limitations of the claims.

INDUSTRIAL FEASIBILITY

In the method for forming a transparent electrode film for display and the transparent electrode film for display according to the present invention, the fine electrode pattern is exposed to the surface from which the release film is removed, and therefore the contact between the electrodes are more easily implemented, exhibiting excellent surface roughness and may be easily applied to the transparent electrode for display.

What is claimed is:

1. A method for producing a transparent electrode film for display, the method comprising:
   forming an electrode pattern by printing a fine electrode pattern on a release film using a conductive ink composition;
   forming an insulating layer by applying an insulating resin on the release film on which the fine electrode pattern is formed so as to cover the fine electrode pattern;
   forming a substrate layer by laminating a substrate on the insulating layer;
   removing the release film; and
   removing residue conductive ink composition that is formed of a same material as the electrode pattern and disposed between electrodes of the fine electrode pattern during the step of forming an electrode pattern and remains on the insulating layer after the step of removing the release film, wherein the step of removing residue conductive ink composition includes:
   dissolving the residue conductive ink composition using an etching solution, and
   pushing liquid that contains both the etching solution and the dissolved residue conductive ink composition using a residue managing member.

2. The method according to claim 1, wherein the insulating resin is a thermosetting resin or UV curable resin.

3. The method according to claim 1, wherein the etching solution comprises at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex and mercapto compound, and an oxidizing agent.

4. The method according to claim 1,
wherein the residue managing member includes at least one of a doctor blade, wiper, and brush.

5. A method for producing a transparent electrode film for display, the method comprising:
forming an electrode pattern by printing a fine electrode pattern on a release film using a conductive ink composition;
forming an insulating layer on the release film on which the electrode pattern has been formed;
forming a substrate layer by laminating a substrate on the insulating layer;
removing the release film;
removing residue conductive ink composition that is formed of a same material as the electrode pattern and disposed between electrodes of the fine electrode pattern during the step of forming an electrode pattern and remains on the insulating layer after the step of removing the release film, wherein the step of removing residue conductive ink composition includes:
dissolving the residue conductive ink composition using an etching solution, and
pushing liquid that contains both the etching solution and the dissolved residue conductive ink composition; and
forming a conductive material to produce a hybrid type transparent electrode film by depositing or printing the conductive material on the fine electrode pattern from which the release film has been removed.

6. The method according to claim 5,
wherein the release film is formed by preparing the release film by applying a silicon-based or acryl-based releasing agent on a thermo-resistant film.

7. The method according to claim 5,
wherein at the forming a conductive material, the conductive material is ITO, AZO, CNT, graphene, or conductive polymer.

* * * * *